(12) United States Patent
Lee

(10) Patent No.: US 9,252,111 B2
(45) Date of Patent: Feb. 2, 2016

(54) METHOD FOR HANDLING VERY THIN DEVICE WAFERS

(71) Applicant: Intel Corporation, Santa Clara, CA (US)

(72) Inventor: Kevin J. Lee, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/625,579

(22) Filed: Feb. 18, 2015

(65) Prior Publication Data
US 2015/0162290 A1    Jun. 11, 2015

Related U.S. Application Data

(62) Division of application No. 13/994,660, filed as application No. PCT/US2011/054428 on Sep. 30, 2011, now Pat. No. 8,994,174.

(51) Int. Cl.
*H01L 23/00* (2006.01)
*H01L 23/538* (2006.01)
(Continued)

(52) U.S. Cl.
CPC ............ *H01L 24/11* (2013.01); *H01L 21/6835* (2013.01); *H01L 21/76898* (2013.01); *H01L 23/5384* (2013.01); *H01L 24/06* (2013.01); *H01L 24/27* (2013.01); *H01L 24/73* (2013.01);
(Continued)

(58) Field of Classification Search
CPC ............ H01L 2224/27; H01L 2224/94; H01L 2224/11; H01L 21/76898; H01L 2221/68381; H01L 2224/92; H01L 2224/81; H01L 2224/11849; H01L 2224/271; H01L 2224/27848; H01L 2224/81815; H01L 2224/83856; H01L 2224/03; H01L 2224/11848; H01L 31/0512; H01L 21/6835; H01L 2221/68359; H01L 2224/05009; H01L 2224/73104; H01L 2224/83862; H01L 2225/06541; H01L 24/17; H01L 24/94; B32B 2398/20; B29C 65/4835
See application file for complete search history.

(56) References Cited

U.S. PATENT DOCUMENTS 6,410,415 B1 * 6/2002 Estes ..................... H01L 21/563
257/778
6,538,210 B2    3/2003 Sugaya et al.
(Continued)

FOREIGN PATENT DOCUMENTS

EP    1 087 434 A2    3/2001
EP    1 517 367 A2    3/2005
(Continued)

OTHER PUBLICATIONS

Notice of Reasons for Rejection from the Japan Patent Office for Japanese Patent Application No. 2014-533278 dated Aug. 4, 2015 and English Translation thereof.
(Continued)

*Primary Examiner* — Thomas L Dickey
*Assistant Examiner* — Gustavo Ramallo
(74) *Attorney, Agent, or Firm* — Blakely, Sokoloff, Taylor & Zafman LLP

(57) ABSTRACT

A structure and method of handling a device wafer during through-silicon via (TSV) processing are described in which a device wafer is bonded to a temporary support substrate with a permanent thermosetting material. Upon removal of the temporary support substrate a planar frontside bonding surface including a reflowed solder bump and the permanent thermosetting material is exposed.

14 Claims, 6 Drawing Sheets

(51) Int. Cl.
   *H01L 25/065* (2006.01)
   *H01L 21/768* (2006.01)
   *H01L 21/683* (2006.01)

(52) U.S. Cl.
   CPC ............ *H01L 24/92* (2013.01); *H01L 25/0657* (2013.01); *H01L 24/02* (2013.01); *H01L 24/05* (2013.01); *H01L 24/13* (2013.01); *H01L 24/16* (2013.01); *H01L 24/17* (2013.01); *H01L 24/29* (2013.01); *H01L 24/32* (2013.01); *H01L 24/81* (2013.01); *H01L 24/94* (2013.01); *H01L 2221/6834* (2013.01); *H01L 2221/6835* (2013.01); *H01L 2221/68327* (2013.01); *H01L 2221/68359* (2013.01); *H01L 2221/68381* (2013.01); *H01L 2224/0231* (2013.01); *H01L 2224/0401* (2013.01); *H01L 2224/05009* (2013.01); *H01L 2224/05568* (2013.01); *H01L 2224/05624* (2013.01); *H01L 2224/05647* (2013.01); *H01L 2224/06181* (2013.01); *H01L 2224/11001* (2013.01); *H01L 2224/1183* (2013.01); *H01L 2224/1184* (2013.01); *H01L 2224/11849* (2013.01); *H01L 2224/13023* (2013.01); *H01L 2224/13025* (2013.01); *H01L 2224/13109* (2013.01); *H01L 2224/13111* (2013.01); *H01L 2224/13116* (2013.01); *H01L 2224/16145* (2013.01); *H01L 2224/16146* (2013.01); *H01L 2224/16225* (2013.01); *H01L 2224/16227* (2013.01); *H01L 2224/17181* (2013.01); *H01L 2224/271* (2013.01); *H01L 2224/27003* (2013.01); *H01L 2224/27436* (2013.01); *H01L 2224/27848* (2013.01); *H01L 2224/2919* (2013.01); *H01L 2224/73104* (2013.01); *H01L 2224/81191* (2013.01); *H01L 2224/81204* (2013.01); *H01L 2224/81815* (2013.01); *H01L 2224/83191* (2013.01); *H01L 2224/83192* (2013.01); *H01L 2224/83856* (2013.01); *H01L 2224/83862* (2013.01); *H01L 2224/92* (2013.01); *H01L 2224/9202* (2013.01); *H01L 2224/9211* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01); *H01L 2924/013* (2013.01); *H01L 2924/014* (2013.01); *H01L 2924/01026* (2013.01); *H01L 2924/01027* (2013.01); *H01L 2924/01028* (2013.01); *H01L 2924/01029* (2013.01); *H01L 2924/01046* (2013.01); *H01L 2924/01078* (2013.01); *H01L 2924/01079* (2013.01); *H01L 2924/1306* (2013.01); *H01L 2924/13091* (2013.01); *H01L 2924/1461* (2013.01); *H01L 2924/181* (2013.01); *H01L 2924/3512* (2013.01)

(56) References Cited

U.S. PATENT DOCUMENTS

| | | | |
|---|---|---|---|
| 6,943,440 B2 | 9/2005 | Kim et al. | |
| 7,064,446 B2 | 6/2006 | Barnak et al. | |
| 7,088,005 B2 | 8/2006 | Lee | |
| 7,312,104 B2 | 12/2007 | Noro | |
| 7,391,112 B2 | 6/2008 | Li et al. | |
| 7,417,325 B2 | 8/2008 | Farnworth et al. | |
| 7,442,634 B2 | 10/2008 | Dubin et al. | |
| 7,498,675 B2 | 3/2009 | Farnworth et al. | |
| 7,633,165 B2 | 12/2009 | Hsu et al. | |
| 7,659,612 B2 | 2/2010 | Hembree et al. | |
| 7,683,459 B2 | 3/2010 | Ma et al. | |
| 7,883,991 B1 | 2/2011 | Wu et al. | |
| 8,580,683 B2 | 11/2013 | Wang et al. | |
| 2001/0019075 A1* | 9/2001 | Abe | B23K 35/3613 228/224 |
| 2001/0053564 A1 | 12/2001 | Yagi et al. | |
| 2003/0001283 A1 | 1/2003 | Kumamoto | |
| 2004/0104486 A1 | 6/2004 | Boon | |
| 2004/0113283 A1 | 6/2004 | Farnworth | |
| 2004/0234689 A1* | 11/2004 | Morganelli | H01L 21/563 427/256 |
| 2005/0110131 A1 | 5/2005 | Lee | |
| 2005/0250323 A1 | 11/2005 | Barnak et al. | |
| 2005/0287785 A1 | 12/2005 | Lee | |
| 2006/0012039 A1 | 1/2006 | Kim et al. | |
| 2006/0142424 A1* | 6/2006 | Shah | C08J 9/32 523/218 |
| 2007/0190776 A1 | 8/2007 | Kim et al. | |
| 2007/0200257 A1 | 8/2007 | Chow | |
| 2008/0061115 A1 | 3/2008 | Ostmann | |
| 2008/0122078 A1 | 5/2008 | He et al. | |
| 2008/0192453 A1* | 8/2008 | Koide | H05K 3/462 361/792 |
| 2008/0303163 A1 | 12/2008 | Liu et al. | |
| 2009/0001602 A1 | 1/2009 | Chung | |
| 2010/0144118 A1 | 6/2010 | Yang et al. | |
| 2011/0159639 A1 | 6/2011 | Yee | |
| 2011/0175237 A1 | 7/2011 | Tomura et al. | |
| 2014/0151739 A1 | 6/2014 | Koizumi et al. | |

FOREIGN PATENT DOCUMENTS

| | | |
|---|---|---|
| JP | 2002-124531 A | 4/2002 |
| JP | 2003-023034 A | 1/2003 |
| JP | 2006-332354 A | 12/2006 |
| JP | 2007-317822 A | 12/2007 |
| JP | 2010-245534 A | 10/2010 |
| JP | 2011-151259 A | 8/2011 |
| KR | 10-2008-0111156 | 12/2008 |
| KR | 10-2008-0114030 | 12/2008 |
| TW | 200517435 A | 6/2005 |
| TW | 200801092 A | 1/2006 |
| TW | 200915451 A | 1/2006 |
| TW | 201034132 A | 3/2009 |
| TW | 201023298 A | 6/2010 |
| TW | 201130022 A | 1/2011 |
| WO | WO 2006/049853 A2 | 5/2006 |
| WO | WO 2007/133302 A2 | 11/2007 |

OTHER PUBLICATIONS

Official Letter and Search Report (English translation or Search Report) for Taiwan Patent Application No. 101131840 dated Feb. 4, 2015, 4 pages.

Notice of Preliminary Rejection from Korean Intellectual Property Office (KIPO) for Korean Patent Application No. 10-2014-7008445 dated May 15, 2015 and English Translation thereof.

Communication of the European Patent Office dated Jun. 26, 2015 for European Application No. 11873373.2-1552/2761651, PCT/US2011/054428 and Supplementary Search Report, 14 pages.

"Solderability" Wikipedia, the free encyclopedia, Jun. 16, 2011, XP055196608, Retrieved from the Internet: URL:http://en.wikipedia.org/w/index.php?title=Solderability&oldid=434547375, 2 pages.

Feger et al, "The Over-Bump Applied Resin Wafer-Level Underfill Process: Process, Material and Reliability," IBM Research Report, IBM Research Division, RC24851 (W0908-142) Aug. 31, 2009, 5 pgs.

"3DIC & TSV Interconnects, 2010 Report Series,"Yole Developpement, 2010, 15 pgs.

PCT International Search Report and Written Opinion for International Application No. PCT/US2011/054428, mailed May 11, 2012, 9 pages.

Notice of Final Rejection from the Korean Intellectual Property Office for Korean Patent Application No. 10-2014-7008445 dated Nov. 24, 2015 and English Summary thereof.

* cited by examiner

METHOD FOR HANDLING VERY THIN DEVICE WAFERS

This is a Divisional of application Ser. No. 13/994,660 filed Jun. 14, 2013 which is a U.S. National Phase Application under 35 U.S.C. §371 of International Application No. PCT/US2011/054428 filed Sep. 30, 2011.

BACKGROUND OF THE INVENTION

1. Field of the Invention

The present invention relates to three dimensional (3D) packaging, and more particularly, to the integration of through-silicon vias (TSVs).

2. Discussion of Related Art 3D packaging is emerging as a solution for microelectronics development toward system on chip (SOC) and system in package (SIP). In particular, 3D flip chip structures with TSVs have the potential for being widely adopted. TSV 3D packages generally contain two or more chips stacked vertically, with vias through silicon substrates replacing edge wiring to create an electrical connection between the circuit elements on each chip.

During TSV processing a device wafer is typically thinned back to 50-100 μm in thickness. Wafers this thin cannot be handled successfully without some type of support system to hold the wafers flat and to protect the fragile thinned wafer from mechanical damage such as chipping, cracking, etc.

Current TSV processes typically include attaching the device wafer to a temporary support wafer using a temporary adhesive and then detaching the thinned device wafer from the support wafer at the end of the process flow sequence. Several implementations may be used for detaching the thinned device wafer from the support wafer.

In a first implementation, a thermal release is used. In this implementation a thermoplastic adhesive is used to temporarily bond the device wafer to a temporary support wafer. Once the TSV processing is completed, heat is used to soften the adhesive and then the thinned device wafer is mechanically separated from the temporary support wafer.

In a second implementation, an ultraviolet (UV) release is used. In this implementation the device wafer is attached to a temporary glass carrier wafer using a UV-curable temporary adhesive in conjunction with a light-to-heat conversion (LTHC) release coating. After TSV processing is completed, laser radiation is applied through the glass carrier wafer to the LTHC layer, thus weakening it. The glass carrier is then lifted off of the thinned device wafer, and then the UV-curable adhesive is peeled off of the thinned device wafer.

In a third implementation, a solvent release is used. In this implementation the device wafer is attached to a perforated temporary carrier wafer using a temporary adhesive. Once TSV processing is completed, a solvent is applied through the perforations in the temporary carrier wafer to dissolve away the temporary adhesive.

In each of the three implementations the temporary adhesives are all mechanically soft, and offer minimal protection to the fragile device wafer against mechanical damage during TSV processing.

DETAILED DESCRIPTION OF THE PRESENT INVENTION

Figure 1:
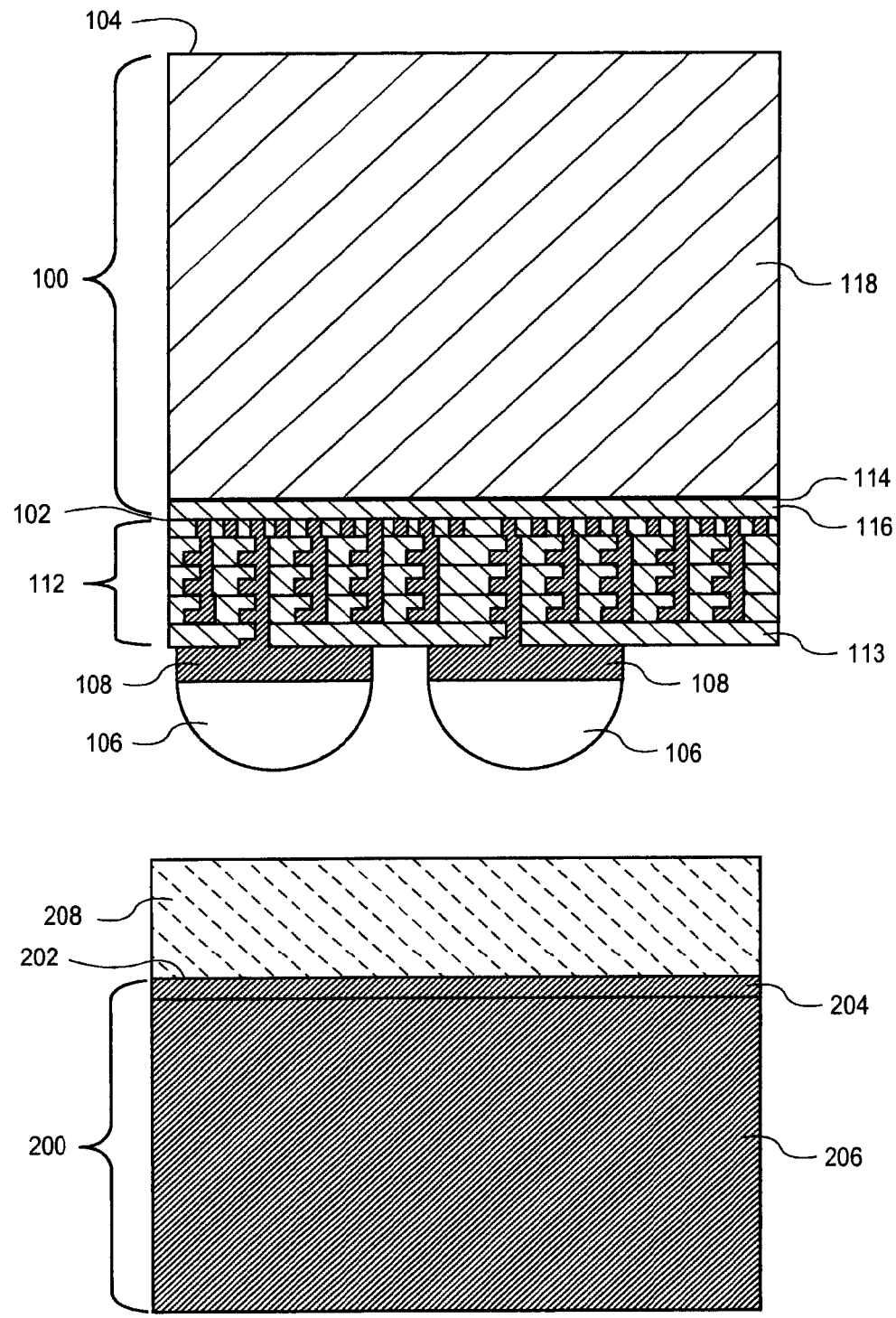
FIG. 1 is a cross-sectional side view illustration of an inverted device wafer prior to bonding to a support substrate in accordance with embodiments of the invention.

In various embodiments, a structure and method of handling a device wafer during TSV processing are described with reference to figures. However, certain embodiments may be practiced without one or more of these specific details, or in combination with other known methods and materials. In the following description, numerous specific details are set forth, such as specific materials and processes, etc. in order to provide a thorough understanding of the present invention. In other instances, well-known packaging processes and manufacturing techniques have not been described in particular detail in order to not unnecessarily obscure the present invention. Reference throughout this specification to "an embodiment" or "one embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

The terms "over", "to", "between" and "on" as used herein may refer to a relative position of one layer with respect to other layers. One layer "over" another layer or bonded "to" another layer may be directly in contact with the other layer or may have one or more intervening layers. One layer "between" layers may be directly in contact with the layers or may have one or more intervening layers. In contrast, a first layer "on" a second layer is in contact with that second layer.

In accordance with embodiments of the present invention a structure and process are described for temporarily supporting a device wafer with a substrate support and permanent adhesive material, such as a cured thermosetting material, which may provide mechanical rigidity and stiffness to mechanically support TSV processing of the device wafer. Such a process may involve attaching the device wafer to a temporary support substrate using the permanent adhesive material, and then detaching the temporary support substrate once the TSV processing is completed. It is to be appreciated that while "via last" TSV processing (vias made after metallization structure) is described and illustrated in detail, that embodiments of the invention are not so limited, and that embodiments of the invention are also compatible with "via first" TSV processing (vias made before the microelectronic device is formed) and "via middle" TSV processing (vias made between forming the microelectronic device and the metallization structure). In addition, while embodiments are described with reference to TSV processing, the embodiments are also applicable to substrates other than silicon wafers, such as compound III-V wafers or II-VI wafers.

In an embodiment, a structure is described including a semiconductor substrate having a front surface, a back surface, a microelectronic device and a via (e.g. TSV) extending through the semiconductor substrate between the back surface and the front surface. One or more reflowed solder bumps are formed over the front surface, and a cured thermosetting material is formed over the front surface and around the one or more reflowed solder bumps. Together the cured thermosetting material and one or more reflowed solder bumps form a planar frontside bonding surface. In some embodiments, the semiconductor substrate may be a TSV processed device wafer including a plurality of the described structures. Alternatively, the TSV processed device wafer is singulated to form a plurality of the semiconductor substrates which may or may not be further processed to form a plurality of chips, which may then be integrated into 3D packaging structures. Thus, in an embodiment the structure is a chip.

In an embodiment a 3D packaging structure is described including a substrate and a chip including the previously described structure in which the planar frontside bonding surface is attached to the substrate. In such an embodiment, one or more additional chips may then be stacked over the chip.

In an embodiment, a method is described which includes bonding a device wafer to a support substrate under heat and pressure. The device wafer may include a front surface and one or more solder bumps formed over the front surface. The support substrate may include a planar wetting surface. A layer of thermosetting material may be formed on the planar wetting surface. During bonding under heat and pressure the solder bumps penetrate the layer of the thermosetting material and spread across or wet the planar wetting surface during reflow, and the thermosetting material is at least partially cured. The substrate support may then be removed to expose a planar frontside bonding surface including the reflowed solder bumps and the at least partially cured thermosetting material. In a via last process flow, one or more vias may be formed to extend between the front surface and the back surface of the device wafer after bonding and prior to removing the support substrate. It is to be appreciated that a grinding or chemical mechanical polishing (CMP) operation may be performed on the back surface of the device wafer to reduce the thickness of the device wafer prior to forming the vias. In a via first or via middle process flow, one or more vias may have been formed to extend between the front surface and the back surface of the device wafer prior to bonding.

Referring now to FIGS. 1-5 a method of manufacture is described with reference to the figures. As illustrated in FIG. 1, an inverted device wafer 100 is illustrated over a support substrate 200. Device wafer 100 may include a front surface 102 and a back surface 104. The device wafer 100 may have a variety of formations. For example, the device wafer may be a bulk semiconductor, include an epitaxial layer overlying a bulk semiconductor, or include a semiconductor-on-insulator (SOI) structure, though other structures may be used. In the particular embodiment illustrated, the device wafer 100 includes a (SOI) structure including semiconductor layer 116 overlying insulator layer 114, and bulk substrate 118. The device wafer 100 may additionally include doped regions or other doped features to form various microelectronic devices such as metal-insulator-semiconductor field effect transistors (MOSFETs), capacitors, inductors, resistors, diodes, microelectro-mechanical systems (MEMS), other suitable active or passive devices, and combinations thereof.

A metallization structure 112 may be formed over the front surface 102 of the substrate 100. As illustrated, metallization structure 112 includes multiple interconnect layers formed of conductive metals such as copper, aluminum, etc. and interlayer dielectric materials such as silicon oxide, carbon doped oxide, silicon nitride, etc. A passivation layer 113 may be formed on an upper portion of the metallization structure 112 to provide physical and chemical protection. One or more conductive pads 108 (e.g. copper, aluminum, etc.) may be provided over the openings in the passivation layer 113, and one or more solder bumps 106 may be formed on the conductive pads 108.

Support substrate 200 may include a planar wetting surface 202, which is formed of a material which has acceptable adhesive forces with the solder bump 106 material during reflow so that the solder bump 106 spreads across or wets the planar wetting surface 202 during reflow. In some embodiments, the solder bump 106 may be a tin based, lead-tin based, indium based, or lead based material. In such embodiments, the planar wetting surface 202 may be formed of a solder wettable metal such as nickel, gold, platinum, palladium, cobalt, copper, iron, and steel. It is also contemplated that a non-metal planar wetting surface 202 may be utilized which possesses a sufficient adhesion to the solder bump 106 during reflow.

The planar wetting surface 202 may be formed integrally with a bulk support substrate 200. For example, support substrate 200 may be a bulk metal such as copper, for example, with a smooth, planar wetting surface 202. The planar wetting surface 202 may also be formed as a separate layer 204 over a bulk substrate 206. Layer 204 may possess preferred characteristics for wetting or polishing. Materials for forming bulk substrate 206 and layer 204 may also be selected based upon their cost, etching characteristics and ease of removal after bonding the device wafer to the substrate support.

Still referring to FIG. 1, a layer of thermosetting material 208 is formed on the planar wetting surface 202. The layer of thermosetting material 208 may be formed of a suitable underfill-type or buffer coat-type material such as, but not limited to, an epoxy resin, phenolic resin, polyimide and poly-benzoxazole (PBO). The layer of thermosetting material 208 may be applied in a variety of manners including spin coating and sheet lamination. The layer of thermosetting material 208 may also be B-stage cured prior to or after being applied to the planar wetting surface 202.

Figure 2:
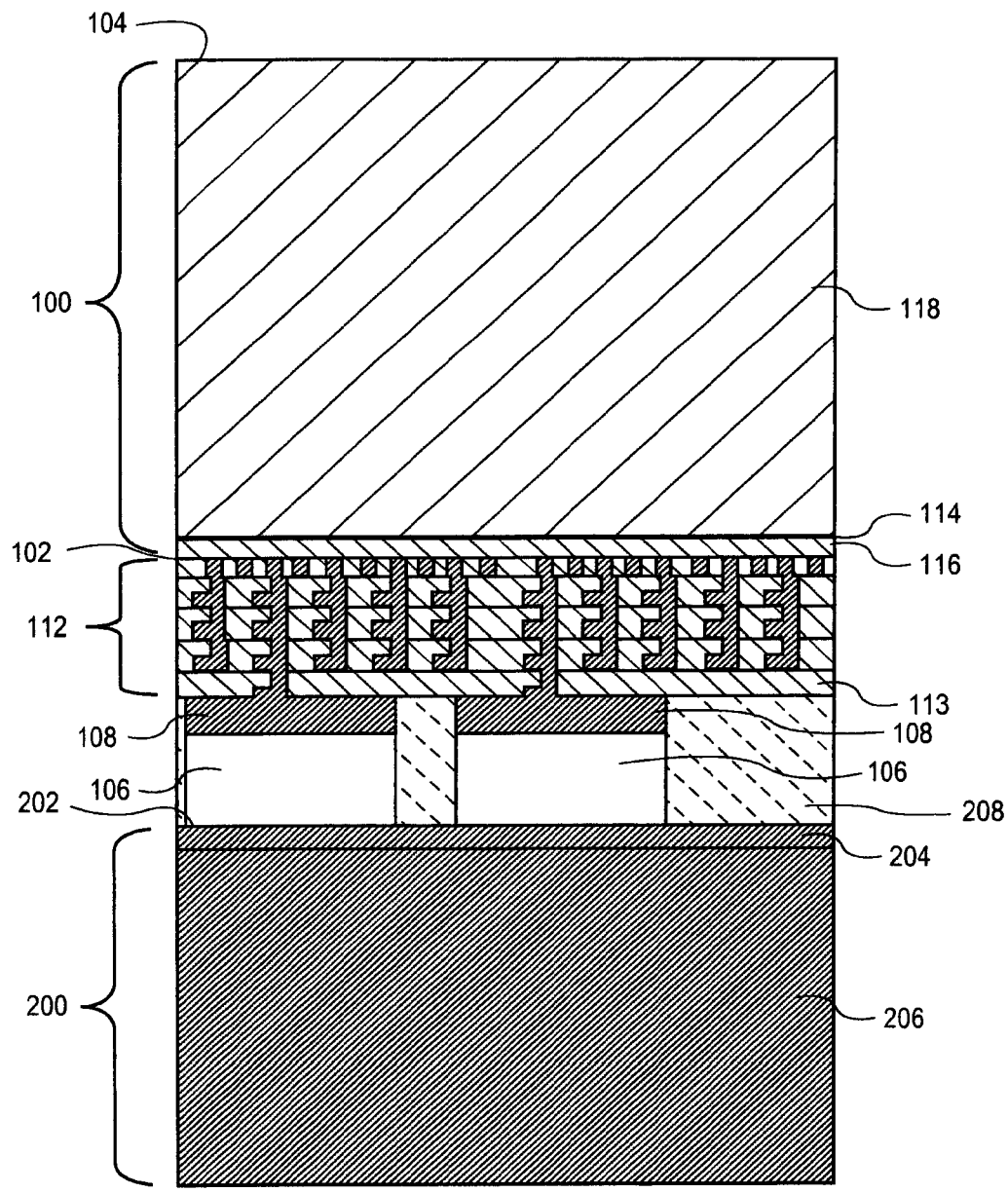
FIG. 2 is a cross-sectional side view illustration of an inverted device wafer bonded to a support substrate in accordance with embodiments of the invention.

Referring now to FIG. 2, the device wafer 100 is bonded to the support substrate 200 under heat and pressure. As illustrated, the plurality of solder bumps 106 penetrate the layer of thermosetting material 208 and spread across or wets the planar wetting surface 202 during reflow. At the same time, the layer of thermosetting material 208 is at least partially cured.

In accordance with embodiments of the invention, bonding is performed on the wafer scale in which a bond head picks up the device wafer 100 on the back side 104 and places the device wafer 100 onto the substrate support 200, which in turn is supported on a pedestal. The particular thermal bonding profiles may be dependent upon the type of solder bump 106 and thermosetting material 208. In an exemplary thermal compression bonding (TCB) process, the support substrate 200 is held at a staging temperature of 100° C., for example. The device wafer 100 may be picked up with a bond head at a staging temperature of 100° C., for example. The device wafer 100 is then placed onto the support substrate 200, and the bond head temperature is then ramped to a temperature (e.g. 250° C.-300° C.) which is above the liquidus temperature of solder bumps 106. The bond head temperature is then maintained for a time above the liquidus temperature of the solder (TAL), and the bond head temperature is then reduced to a temperature (e.g. 180° C.) which is below the liquidus temperature of the solder bumps 106. At this point the bonded structure may be removed from the pedestal for off-line curing or kept on the pedestal at an elevated temperature in an in-line fashion to achieve substantially complete cure of the thermosetting material 208.

Figure 3:
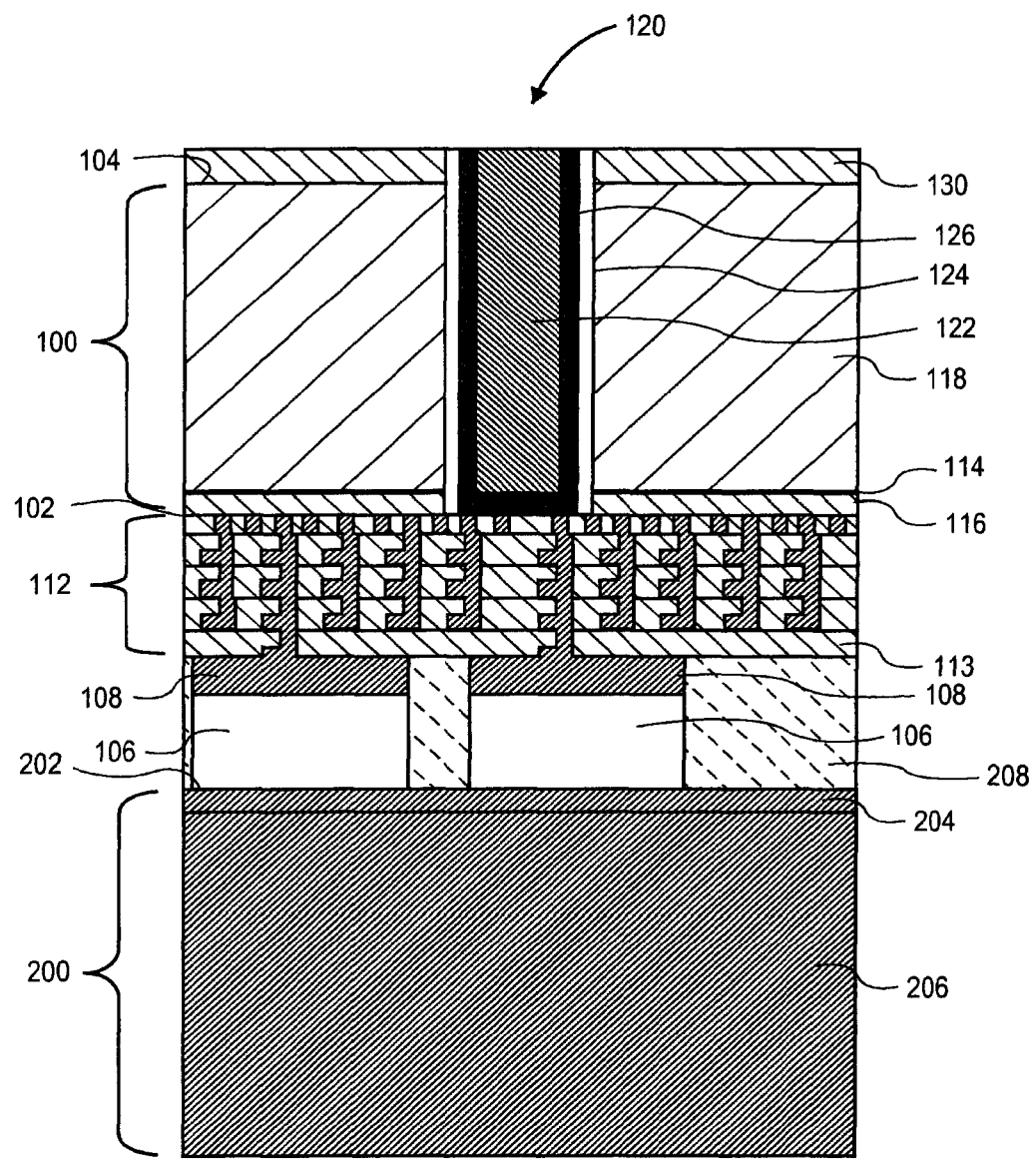
FIG. 3 is a cross-sectional side view illustration of via last processing of an inverted device wafer bonded to a support substrate in accordance with embodiments of the invention.

Referring now to FIG. 3 "via last" processing is illustrated in which the device wafer 100 is processed to form at least one via 120 (e.g. TSV) extending between the front surface 102 and the back surface 104 of the wafer. While only one via 120 is illustrate in FIG. 3, it is to be appreciated that this is for illustrational purposes only, and that multiple vias may be formed in the device wafer in accordance with embodiments of the invention. In addition, while "via last" processing is illustrated, it is understood that embodiments of the invention are also compatible with "via first" and "via middle" processing in which the via 120 is formed prior to bonding the device wafer 100 to the support substrate 200.

Prior to forming via 120, the device wafer 100 may be thinned back by grinding and/or chemical mechanical polishing (CMP) the back surface 104. For example, the device wafer 100 may be thinned back to approximately 50-100 μm in an embodiment. After thinning the device wafer 100 a passivation film or film stack 130 may be formed over the back surface 104 to provide a hermetic barrier. While not illustrated, it is to be appreciated that the device wafer 100 may be additionally processed to form redistribution lines (RDL) and other build-up structures before, during or after processing of via 120.

In order to form via 120, a photoresist material may be formed over the back surface 104 of the thinned device wafer 100, and then exposed and developed. After develop there are openings in the resist coating at those locations where the vias 120 are desired. In the case of a silicon device wafer, through-silicon via (TSV) openings are formed by plasma etching through the passivation film or film stack 130 and through the bulk silicon 118, stopping on copper landing pads on the front surface 102 (device side) of the thinned device wafer 100. The photoresist is then removed and any remaining etch polymer or residues are cleaned off the device wafer 100. An insulating layer 124 is then deposited onto the wafer surface, lining the bottoms and sidewalls of the through-silicon vias (TSVs) 120. Suitable materials include, but are not limited to, silicon dioxide, silicon nitride, silicon carbide, and various polymers. These materials can be deposited by chemical vapor deposition (CVD), atomic layer deposition (ALD), or spin-coating methods.

An anisotropic etch process may then be used to remove the insulating layer 124 from the bottom surface of the TSVs 120 and on the passivation film or film stack 130 while retaining a substantial thickness on the sidewalls of the TSVs 120. A barrier layer 126 and seed layer may then be deposited onto the device wafer surface. For example, the barrier layer 126 may include tantalum, titanium, or cobalt. The seed layer may be copper, for example. A blanket layer of copper is then electroplated onto the device wafer surface, completely filling the TSVs with copper 122. The copper and barrier layer overburden are then removed by CMP, as illustrated in FIG. 3.

Figure 4:
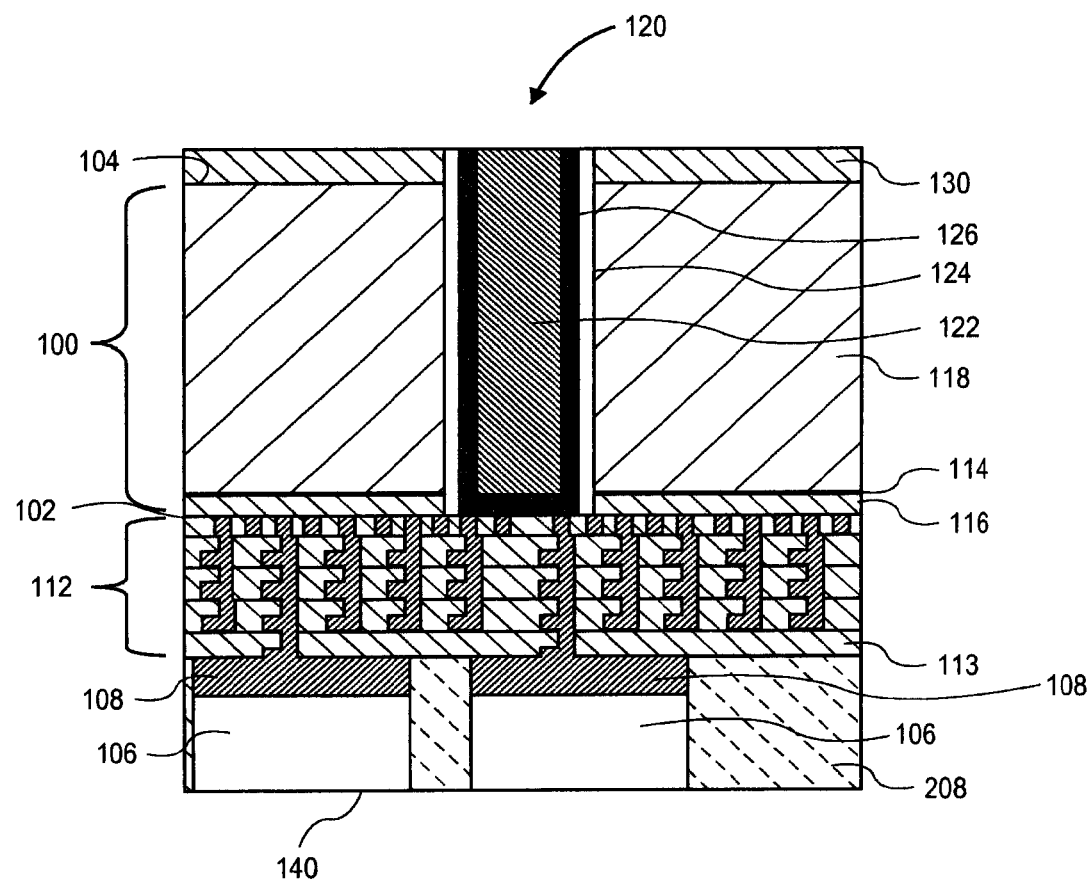
FIG. 4 is a cross-sectional side view illustration of a processed device wafer after removal of a support substrate in accordance with embodiments of the invention.

Referring now to FIG. 4, upon completion of processing of the thinned device wafer 100, the support substrate 200 is then selectively removed. In one embodiment, support substrate 200 is copper, and is removed using a wet etchant such as copper etchant 49-1 from Transcene Co., Inc. which selectively etches away the copper while leaving the reflowed solder bumps 106 and cured thermosetting material 208 substantially unaffected. In another embodiment, the support substrate 200 is formed of a bulk substrate 206 such a metal or plastic material, with a thin layer 204. Where bulk substrate 206 is a plastic material, a solvent may be used to remove the bulk substrate 206, followed by wet etching to remove thin layer 204. In either manner, removal of the support substrate 200 exposes a planar frontside bonding surface 140 which includes the reflowed solder bumps 106 and the at least partially cured thermosetting material 208. In many embodiments, the thermosetting material 208 will have already been fully cured prior to removal of the support substrate 200.

Upon removal of the support substrate 200, the resulting plurality of structures formed on the substrate 100 may be singulated, and then may or may not be further processed to form chips 500, which may then be integrated into 3D packaging structures. For example, the structures may be further processed to include build-up structures over the planar frontside bonding surface 140 or back surface 104. An exemplary 3D packaging structure is illustrated in FIG. 5, in which one or more chips 500 including TSVs formed in accordance with embodiments of the invention can be stacked over a substrate 600 such as a printed circuit board or laminated substrate, and connected with solder elements 502.

Figure 6:
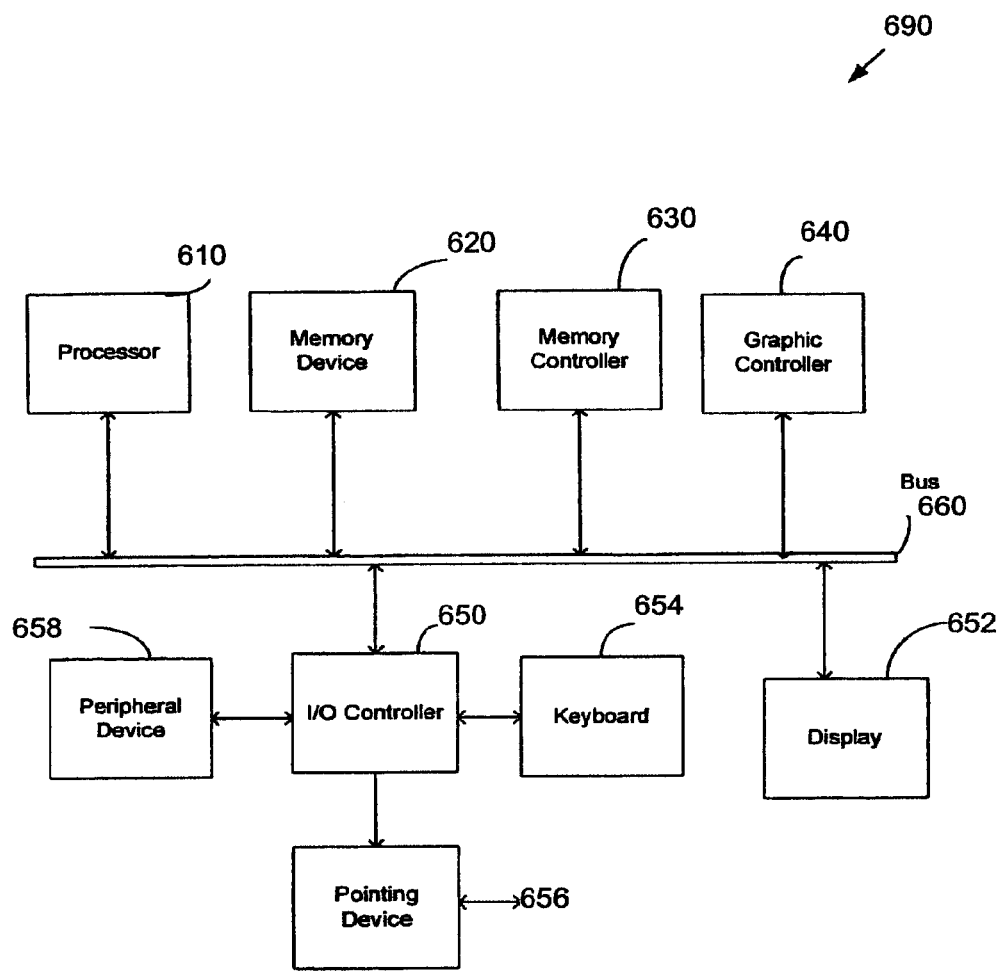
FIG. 6 represents a system in accordance with embodiments of the invention.

FIG. 6 shows a computer system according to an embodiment of the invention. System 690 includes a processor 610, a memory device 620, a memory controller 630, a graphics controller 640, an input and output (I/O) controller 650, a display 652, a keyboard 654, a pointing device 656, and a peripheral device 658, all of which may be communicatively coupled to each other through a bus 660, in some embodiments. Processor 610 may be a general purpose processor or an application specific integrated circuit (ASIC). I/O controller 650 may include a communication module for wired or wireless communication. Memory device 620 may be a dynamic random access memory (DRAM) device, a static random access memory (SRAM) device, a flash memory device, or a combination of these memory devices. Thus, in some embodiments, memory device 620 in system 690 does not have to include a DRAM device.

Figure 5:
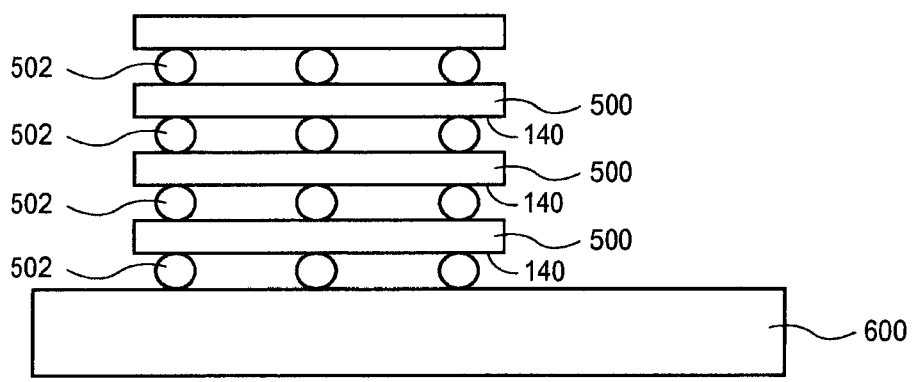
FIG. 5 is a side view illustration of a 3D package implementing TSVs in accordance with embodiments of the invention.

One or more of the components shown in system 690 may be included in/and or may include one or more integrated circuit packages, such as a chip 500 or 3D packaging structure of FIG. 5 for example. For example, processor 610, or memory device 620, or at least a portion of I/O controller 650, or a combination of these components may be included in an integrated circuit package that includes at least one embodiment of a structure described in the various embodiments.

These elements perform their conventional functions well known in the art. In particular, memory device 620 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 610. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 620 may supply the processor 610 with the executable instructions for execution.

System 690 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method comprising:
    providing a device wafer including a front surface and a solder bump formed over the front surface;
    providing a support substrate including a planar wetting surface, wherein a layer of thermosetting material is formed on the planar wetting surface;
    bonding the device wafer to the support substrate under heat and pressure, wherein the bonding comprises:
        penetrating the layer of thermosetting material with the solder bump;
        wetting the planar wetting surface with the solder bump while reflowing the solder bump; and
        at least partially curing the thermosetting material; and
    removing the support substrate to expose a planar frontside bonding surface including the reflowed solder bump and the at least partially cured thermosetting material.

2. The method of claim 1, further comprising forming a via extending between the front surface and a back surface of the device wafer after bonding the device wafer to the support substrate.

3. The method of claim 2, comprising forming the via prior to removing the support substrate.

4. The method of claim 2, comprising grinding or polishing a back surface of the device wafer to reduce the thickness of the device wafer after bonding the device wafer to the support substrate and prior to forming the via.

5. The method of claim 2, wherein the planar wetting surface comprises a material selected from the group consisting of nickel, gold, platinum, palladium, cobalt, copper, iron and steel.

6. The method of claim 2, wherein the support substrate comprises a bulk substrate and a coating layer comprising the planar wetting surface.

7. The method of claim 1, further comprising forming a via extending between the front surface and a back surface of the device wafer prior to bonding the device wafer to the support substrate.

8. The method of claim 1, wherein the planar wetting surface comprises a material selected from the group consisting of nickel, gold, platinum, palladium, cobalt, copper, iron and steel.

9. The method of claim 8, wherein the support substrate is a bulk substrate.

10. The method of claim 9, wherein the bulk substrate is copper.

11. The method of claim 8, wherein the support substrate comprises a bulk substrate and a coating layer which comprises the planar wetting surface.

12. The method of claim 1, further comprising spin coating or laminating the layer of thermosetting material on the planar wetting surface of the support substrate.

13. The method of claim 12, wherein the layer of thermosetting material is b-stage cured prior to bonding the device wafer to the support substrate.

14. The method of claim 1 further comprising:
    attaching a first die to the planar frontside bonding surface; and
    attaching a second die to a back surface of the device wafer.

* * * * *